United States Patent [19]
Horowitz et al.

[11] Patent Number: 5,355,391
[45] Date of Patent: Oct. 11, 1994

[54] HIGH SPEED BUS SYSTEM

[75] Inventors: Mark A. Horowitz, Palo Alto; Winston K. M. Lee, South San Francisco, both of Calif.

[73] Assignee: Rambus, Inc., Mountain View, Calif.

[21] Appl. No.: 847,635

[22] Filed: Mar. 6, 1992

[51] Int. Cl.⁵ .................... H04B 3/00; H04L 25/00
[52] U.S. Cl. .................... 375/36; 370/85.1; 307/530
[58] Field of Search .................... 375/36; 307/475, 530, 307/352, 481; 370/85.1

[56] References Cited

U.S. PATENT DOCUMENTS

| | | | |
|---|---|---|---|
| 4,247,817 | 1/1981 | Heller | 324/73 |
| 4,481,625 | 11/1984 | Roberts et al. | 370/85 |
| 4,493,092 | 1/1985 | Adams | 375/36 |
| 4,519,034 | 5/1985 | Smith et al. | 364/200 |
| 4,785,394 | 11/1988 | Fischer | 364/200 |
| 4,803,699 | 2/1989 | Graham | 375/36 |
| 4,811,202 | 3/1989 | Schabowski | 364/200 |
| 4,860,198 | 8/1989 | Takenaka | 364/200 |
| 4,912,724 | 3/1990 | Wilson | 375/7 |
| 5,023,488 | 6/1991 | Gunning | 307/475 |
| 5,077,756 | 12/1991 | Christopherson | 375/36 |
| 5,097,157 | 3/1992 | Jaffe | 307/530 |

FOREIGN PATENT DOCUMENTS

| | | |
|---|---|---|
| 0450571A2 | 10/1991 | European Pat. Off. |
| 3079134 | 4/1991 | Japan |
| 9102590 | 4/1991 | PCT Int'l Appl. |

OTHER PUBLICATIONS

1987 IEEE International Conference on Computer Design: VLSI in Computers and Processors, Oct. 8, 1987, New York, pp. 468-471, XP000212194, Wooley, et al., "Active Substrate System Integration".

*Primary Examiner*—Stephen Chin
*Assistant Examiner*—Bryan Webster
*Attorney, Agent, or Firm*—Blakely, Sokoloff, Taylor & Zafman

[57] ABSTRACT

In the high speed bus system of the present invention, the bus configuration is one in which all master devices are clustered at one end of an unterminated end of the bus. The slaves are located along the remaining length of the bus and the opposite end of the transmission line of the bus is terminated. By eliminating the termination resistor at the end of the bus where the master devices are located the required drive current needed to produce a given output swing is reduced. The bus drivers and receivers are CMOS integrated circuits. The bus of the present invention is operable utilizing small swing signals which enable sufficient implementation of current mode drivers for low impedance bus signals. In particular, the bus input receiver of the present invention comprises a two stage buffered sampler/amplifier which receives a small swing signal from the bus and samples and amplifies the low swing signal to a full swing signal within a single clock cycle using CMOS circuits.

23 Claims, 4 Drawing Sheets

HIGH SPEED BUS SYSTEM

BACKGROUND OF THE INVENTION

1. Field of the Invention

The present invention is directed to the field of high speed computer buses. In particular, the present invention is directed to the field of current driven high speed computer buses.

2. Art Background

Computer buses provide the means for interconnecting a plurality of computer devices such that the devices may communicate with one another. The buses typically connect master devices such as microprocessors or peripheral controllers and slave devices such as memory components or bus transceivers. Typically the master and slave devices are located at a position along the bus and the bus is terminated at both ends of the transmission line of the bus. In a doubly terminated bus, both ends of the bus signal lines are connected to termination resistors of an impedance which corresponds to the impedance of the signal lines. Thus, when a signal is carried along the transmission line of the bus to the termination resistor, the resistor absorbs the signal eliminating signal reflections which may occur on the bus and cause erroneous signals.

When the bus is doubly terminated, each driver of a device on a bus must effectively drive two buses in parallel, one going to the left and one going to the right of the device's location on the bus. These signals propagate down the bus and the bus will then have been settled when both signals reach the termination resistors. The worst case signal settling time for this bus configuration is equal to the time-of-flight delay, $t_f$, on the bus and which occurs when a driver on one end of the bus is transmitting to a receiver at the opposite end of the bus. The problem with this type of configuration is that the power dissipated by the device driving the bus is quite high since the impedance of the bus is relatively low.

Typically, buses are driven by voltage level signals. However, it has become advantageous to provide buses which are driven by current. One benefit to a current mode bus is a reduction of peak switching current. In a voltage mode device the output transistor of the driver must be sized to drive the maximum specified current under worst case operating conditions. Under nominal conditions with less than maximum load, the current transient when the output is switched, but before it reaches the rail, can be very large. The current mode driver on the other hand draws a known current regardless of load and operating conditions. In addition, impedance discontinuities occur when the driving device is characterized by a low output impedance when in a sending state. These discontinuities cause reflections which dictate extra bus settling time. Current mode drivers, however, are characterized by a high output impedance so that a signal propagating on the bus encounters no significant discontinuity in line impedance due to a driver in a sending state. Thus, reflections are avoided and the required bus settling time is decreased. An example of a current mode bus is disclosed in U.S. Pat. No. 4,481,625 issued Nov. 6, 1984, entitled "High Speed Data Bus System." A current mode bus is also disclosed in PCT international patent application number PCT/US91/02590 filed Apr. 16, 1991, published Oct. 31, 1991, and entitled *Integrated Circuit I/O Using a High Performance Bus Interface* assigned to the common assignee of the present invention.

Design requirements may dictate the use of MOS circuits. If the bus driver is comprised of CMOS integrated circuits, the signal voltage swing of external signals are typically rail to rail swings where the high level voltage is typically 3.3 to 5 volts and the low level voltage is zero volts. Such high voltage swings are not desirable in high speed transmission line buses because of the high level of induced noise and power dissipation. Other systems have sought to alleviate this problem by using various reduced voltage swings, such as GTL (Gunning Transistor Logic), signal levels (0.8 to 1.4 volts). GTL levels have in the past been optimized for voltage mode drivers and are too low in voltage to implement effective current mode drivers. An example of such a system is discussed U.S. Pat. No. 5,023,488, titled "Drivers and Receivers for Interfacing VLSI CMOS Circuits to Transmission Lines."

SUMMARY OF THE INVENTION

It is therefore an object of the present invention to provide a high speed current mode computer bus which minimizes the settling time for the bus.

It is further an object of the present invention to provide a high speed current mode computer bus which interfaces to CMOS circuitry.

It is further an object of the present invention to provide a bus receiver for interfacing CMOS VLSI circuits to high speed current mode buses.

In the high speed bus system of the present invention, the bus configuration is one in which all master devices are clustered at an unterminated end of the bus. The slaves are located along the remaining length of the bus and the opposite end of the transmission line of the bus is terminated. Elimination of the termination resistor at the end of the bus where the master devices are located minimizes power dissipation while maintaining the voltage output swing needed to drive the bus. The bus drivers and receivers are preferably CMOS integrated circuits. The bus of the present invention is operable utilizing small swing signals which enable efficient implementation of current mode drivers for low impedance bus signals. In particular, the bus input receiver of the present invention receives a small swing signal from the bus and samples and amplifies the small swing signal to a full swing signal within a single clock cycle using CMOS circuits which are buffered to minimize distortion due to back injected signals generated by the sampling process.

BRIEF DESCRIPTION OF THE DRAWINGS

The objects, features and advantages of the present invention will be apparent from the following detailed description in which.

DETAILED DESCRIPTION

Figure 1:
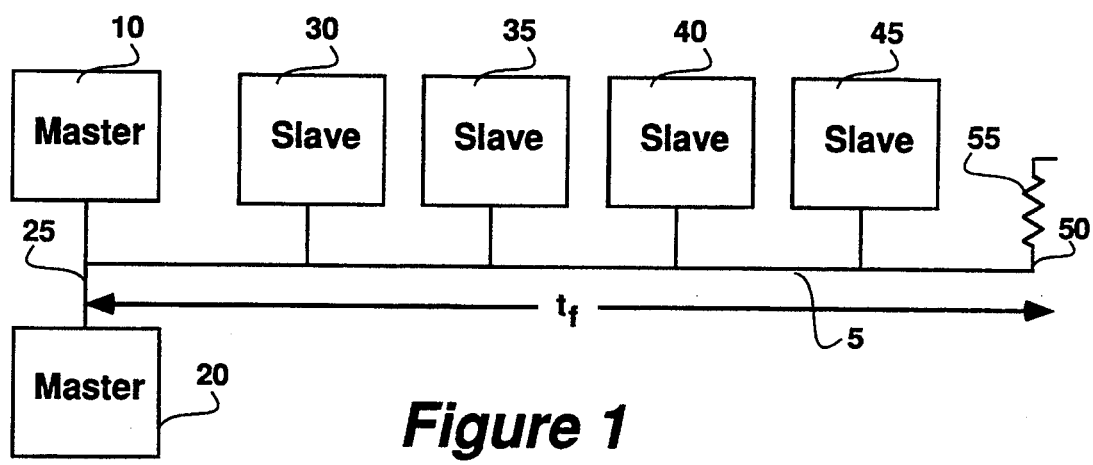
FIG. 1 illustrates the bus configuration utilized in the preferred embodiment of the present invention.

The Bus configuration employed in the high speed, low impendance current driven bus of the present invention is illustrated by the block diagram of FIG. 1. Master devices connected to the bus 10, 20 are coupled at one end 25 of the transmission line 5 of the bus. The slave devices 30, 35, 40, 45 are coupled along the transmission line 5. The opposite end 50 of the transmission line 5 is terminated by termination resistor 55. As noted earlier, the problem with prior art bus configurations is that the power dissipated by the device driving the bus is quite high since the impedance of the bus is relatively low.

In the configuration of the present invention, the amount of power required is reduced by employing this bus configuration as the removal of the termination resistor at the end 55 of the bus reduces the required drive current needed to produce a given output swing. As the master devices are located at the end of the bus, the current driven by the master device output driver produces a full swing signal that propagates along the bus to a slave device. A slave device, located at a point along the bus between the two end points 25, 50 will produce a drive current that is divided at the output to generate a ½ swing signal towards the first end 25 and a ½ swing towards the second end 50. By locating the master devices at the end 25 of the bus and omitting a termination resistor, the master devices will receive a full swing signal resultant of the sum of the ½ swing signal and a ½ swing signal which is the reflection of the ½ swing signal. Thus the master devices placed within the region where the ½ swing signal is doubled will receive a full swing signal due to the sum of the signal and the reflected signal. Preferably the master devices are located at the point where the signal reflection occurs. However, the extent of the region is dictated by the signal width and the signal propagation time along the bus.

Although the removal of the termination resistor at one end causes the bus to settle more slowly, this added delay is not a factor since the bus transactions start or end at the master end of the bus 25. Removal of the termination resistors from one end of the bus leaves the worst case delay to be $t_f$, the same worst case delay found in prior art bus configuration.

This delay, $t_f$, may be better explained by example. In the case of a master device 10 transmitting to a slave device the master sees only a single transmission line of impedance Z as it is connected at the open end of the bus. If the current source of the driving device has a strength I, a signal voltage of I*Z is transmitted down the bus. The signal arrives at the termination resistor and stops at the termination resistor 55 so that the bus settles after one time-of-flight delay, $t_f$. If a signal is transmitted from a slave device to a master device, the device sees two transmission lines, one in either direction, and sends a signal voltage of I*Z/2 in both directions. The signal that travels toward the terminated end reaches the resistor 55 and stops. The signal that travels toward the unterminated end 25 reaches the end 25 and reflects back in the opposite direction doubling in amplitude to provide the needed swing. However, as the master devices 10, 20 are at that end of the bus 25, the devices 10, 20 see the final value after only one $t_f$ even though the bus has not yet fully settled.

It should be noted that the reflected signal that travels back down the bus causes inter-symbol interference for the other slave devices on the bus; but this is not important since the slaves only communicate data to the master and not to other slaves. It is important, however, that the reflective wave not encounter any further disturbances which would cause secondary reflections back to the master, which may cause interference at the master. A potential source of such disturbances is the original slave transmitter on the bus. In the more common type of bus transmitter which uses a voltage source, the low impedance driver would cause a secondary reflection which would again reflect off the unterminated end 25 of the bus and would continue until the energy of the wave was dissipated by line losses. Such a situation could result in very long settling times. In the high speed bus of the present invention, current mode sources are used which presents a high impedance to the reflective wave. Thus, the reflective wave continues to propagate to the terminated end of the bus where it is absorbed by the termination resistor 55.

Figure 2A:
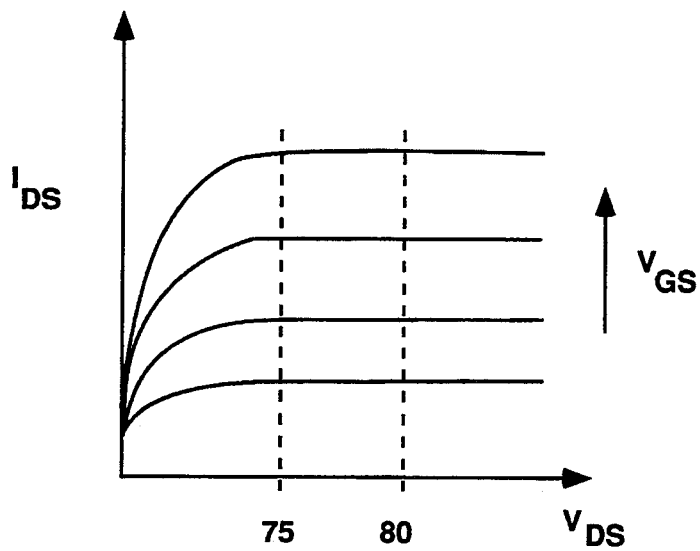
FIG. 2a and 2b illustrate the NMOS device operating as a current source in the preferred embodiment of the high speed bus of the present invention.
Figure 2B:
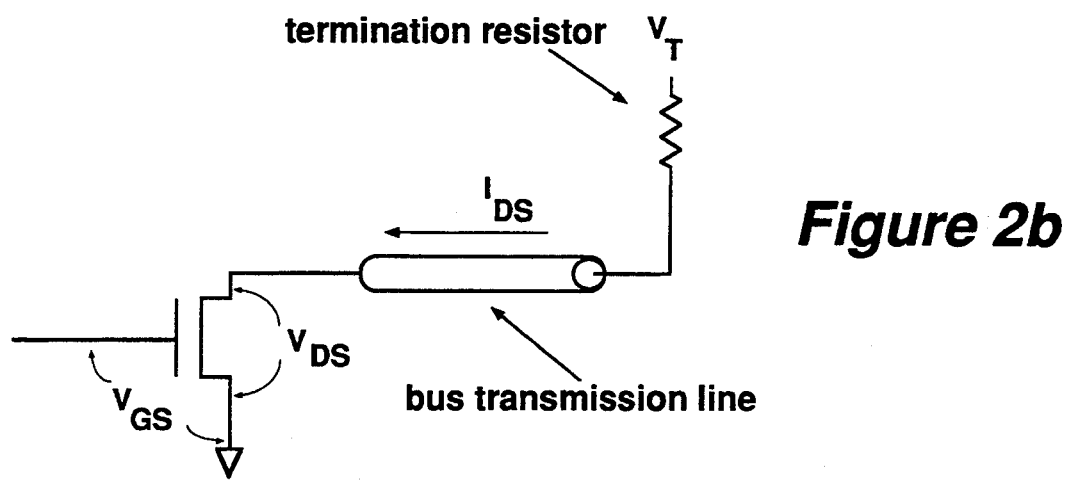

AMOS transistor, when operated under the right conditions, provides a good current source. The graph of FIG. 2a shows the drain current vs. voltage for a typical NMOS device and FIG. 2b illustrates an exemplary current driver As can be seen from the graph of FIG. 2a, as long as the drain-source voltage is kept above a minimum level 75, the output current is constant and essentially independent of $V_{DS}$. Thus, as long as the bus voltage levels $V_{OH}$ and $V_{OL}$ are chosen to be high enough, a simple NMOS device will work well as a current source. However, the larger the value of $V_{OH}$ and $V_{OL}$, the higher the power dissipated when the device is on. Therefore, a balance must be established between current mode behavior and power dissipation. For example, a range 75, 80 as illustrated in FIG. 2a maintains $V_{DS}$ above a minimum level to maintain the current independent of $V_{DS}$ while minimizing $V_{DS}$ to minimize $V_{OH}$ and $V_{OL}$ and thus the power dissipated to operate the device. Preferably, voltage levels of $V_{OH}$ (2.5 volts) and $V_{OL}$ (2.0 volts) are utilized to provide a reasonable compromise between current mode operation and power dissipation. These levels also allow essentially the same driver circuit to be used for 5.0 volt operation as well as in lower voltage, 3.0–3.3 volts, CMOS technologies.

An added benefit to employing a current mode driver operation is the reduction of peak switching over a voltage mode driver. In a voltage mode device the output transistor must be sized to drive the maximum specified current under worst case operating conditions. Under nominal conditions, with less than maximum load, the current transient when the output is switched, but before it reaches the rail, can be very large. The current mode driver, on the other hand, draws a known current regardless of load and operating conditions.

Figure 3:
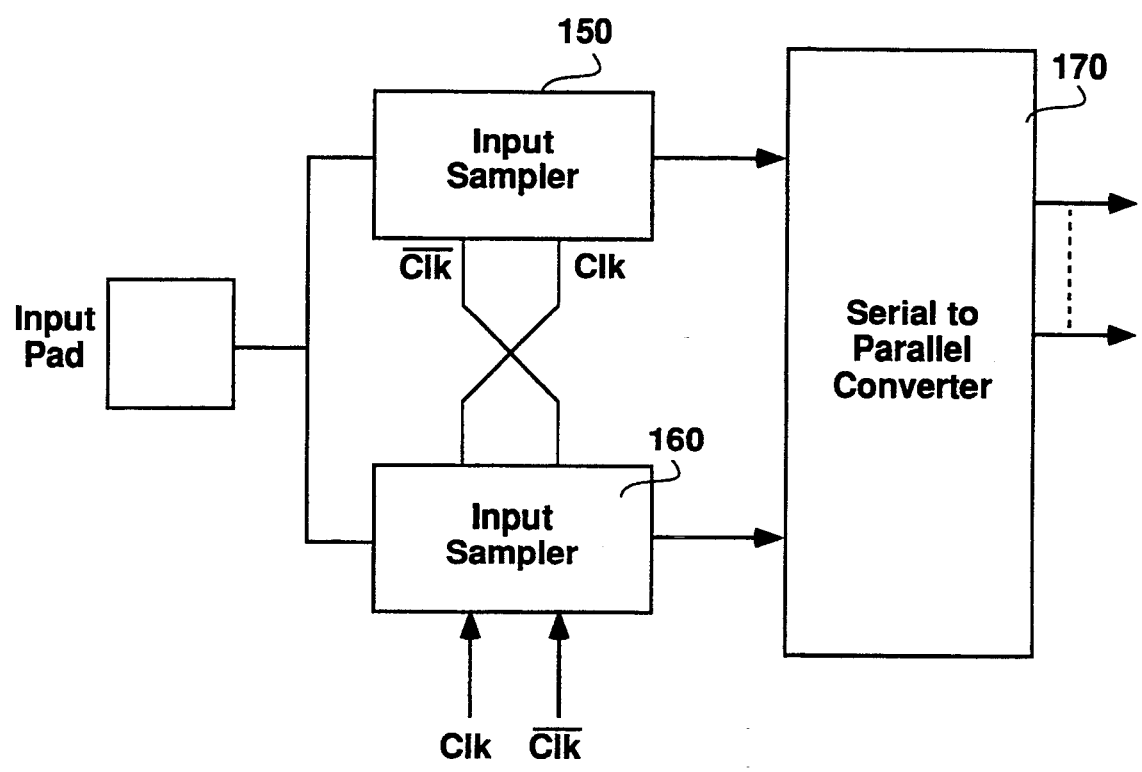
FIG. 3 is a block diagram of the bus receiver utilized in the high speed bus of the present invention.

Referring to FIG. 3, an innovative receiver utilized in the current mode high speed bus of the present invention will be described. In the preferred embodiment of the present invention, the output of the current driver is a current on the order of 25 milliamps. A bus voltage swing of 500 millivolts results when the bus line carries an impedance of 20 ohms. Thus, the bus input receiver must be able to receive the small swing signal and amplify the signal to a large swing rail to rail signal compatible with CMOS circuitry within a relatively short period of time of receipt, preferably one bus cycle. However, it is difficult to sample and amplify small swing signals to large swing rail to rail signals within a single clock cycle using presently available CMOS processes. To overcome this limitation it is preferred that the input circuit comprises two input samplers operating in a ping-pong fashion as shown in FIG. 3, wherein each sampler samples the received signal on alternate clock edges. Alternatively increased frequency of sampling may be provided by other techniques such as quadrature sampling. To simplify the design and to reduce the common mode noise sensitivity of the input receiver, the bus is provided with an additional signal $V_{REF}$ that is nominally at the midpoint of the bus high and low voltages. This signal is used as a reference for comparison to determine whether the bus data signal is high or low.

Figure 4A:
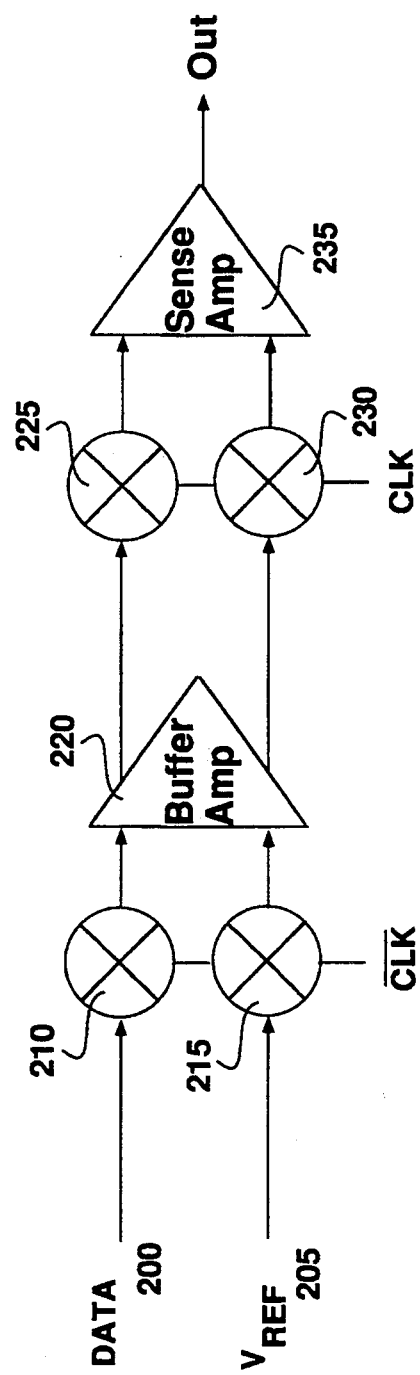
FIG. 4a is a block diagram representation of the clocked buffered amplifier utilized in the bus receiver of the present invention and FIG. 4b provides a more detailed circuit diagram of the clocked buffer amplifier of the receiver device of the high speed bus of the present invention.

Referring to FIG. 3, the input signal from the bus is input to the samplers 150, 160. The first sampler 150 outputs a full swing signal while the second input sampler 160 is processing the currently received small swing signal. The output of the samplers 150, 160 are input to the serial to parallel converter 170 which shifts in parallel the full swing signal to the device. It is preferred that the input sampler circuit have a tight sampling window relative to the duration of a clock cycle in order to be able to increase the speed of the bus while providing for clock skew and bus settling time. In addition, it is preferred that the receiver is able to amplify the bus signals in less than two bus cycles (e.g. 4 ns). It is also preferred that the noise that is back-injected into the bus must be very small since there may be many such sampler circuits of receivers connected to each bus which additively contribute to the noise and therefore increase probability of errors on the bus. To achieve this performance, it is preferred that the input sampler circuit be implemented as a clocked buffered amplifier, as shown in FIG. 4a.

In prior art receiver circuits, such as that disclosed in PCT international patent application number PCT/US91/02590 filed Apr. 16, 1991, published Oct. 31, 1991, and entitled *Integrated Circuit I/O Using a High Performance Bus Interface*, noise is introduced on the bus data lines due to the parasitic capacitance which exists at the sampling gates. Once a signal is sampled, the gate is turned off. When the gate is subsequently turned on to sample the next signal, the parasitic capacitance discharges voltage back onto the bus signal lines. This is referred to as back injecting on to the bus. Although the noise introduced can be nominal, as the number of receivers coupled to the bus increases the amount of noise significantly increases due to the summation of the back injected noise from the receivers. In addition, as small voltage levels are impressed on the bus signal lines, the signals received by the sampling circuit are amplified to be compatible with CMOS circuitry. Thus, the amount of charge injected due to the parasitic capacitance is proportional to the larger, amplified, rail to rail voltage.

An innovative sampling circuit is therefore provided which meets the tight sampling window required while minimizing the detrimental effect of back injected noise on the bus. Referring to FIG. 4a, the receiver circuit of the present invention can be described as a two stage sampler/amplifier. The input voltage (DATA) from the bus 200 and the reference voltage ($V_{REF}$) 205 are sampled by samplers 210, 215 on a first edge of the clock (−CLK) and input to low gain buffer amplifier 220. The buffer amplifier 220 functions to isolate the samplers 210, 215 and the bus inputs 200, 205. On the following edge of the clock (CLK), the DATA and $V_{REF}$ signals output from the buffer amplifier 220 are respectively sampled by samplers 225, 230 and input to sense amplifier 235 which amplifies the differential signal to a full rail to rail signal. Although parasitic capacitance exists at the sampler 210, 215 which discharges its capacitive charge back on the bus lines, the amount of voltage is minimized because only the small swing voltage exists at the samplers and the amplifier and the large rail to rail signal output therefrom is isolated from the samplers.

Thus, by sampling the inputs at a first stage of the circuit, transferring the sampled inputs to a second stage of the circuit isolated from the first stage, and amplifying the inputs at the second stage, a CMOS compatible receiver which minimizes the amount of back injected noise on the bus is achieved.

Figure 4B:
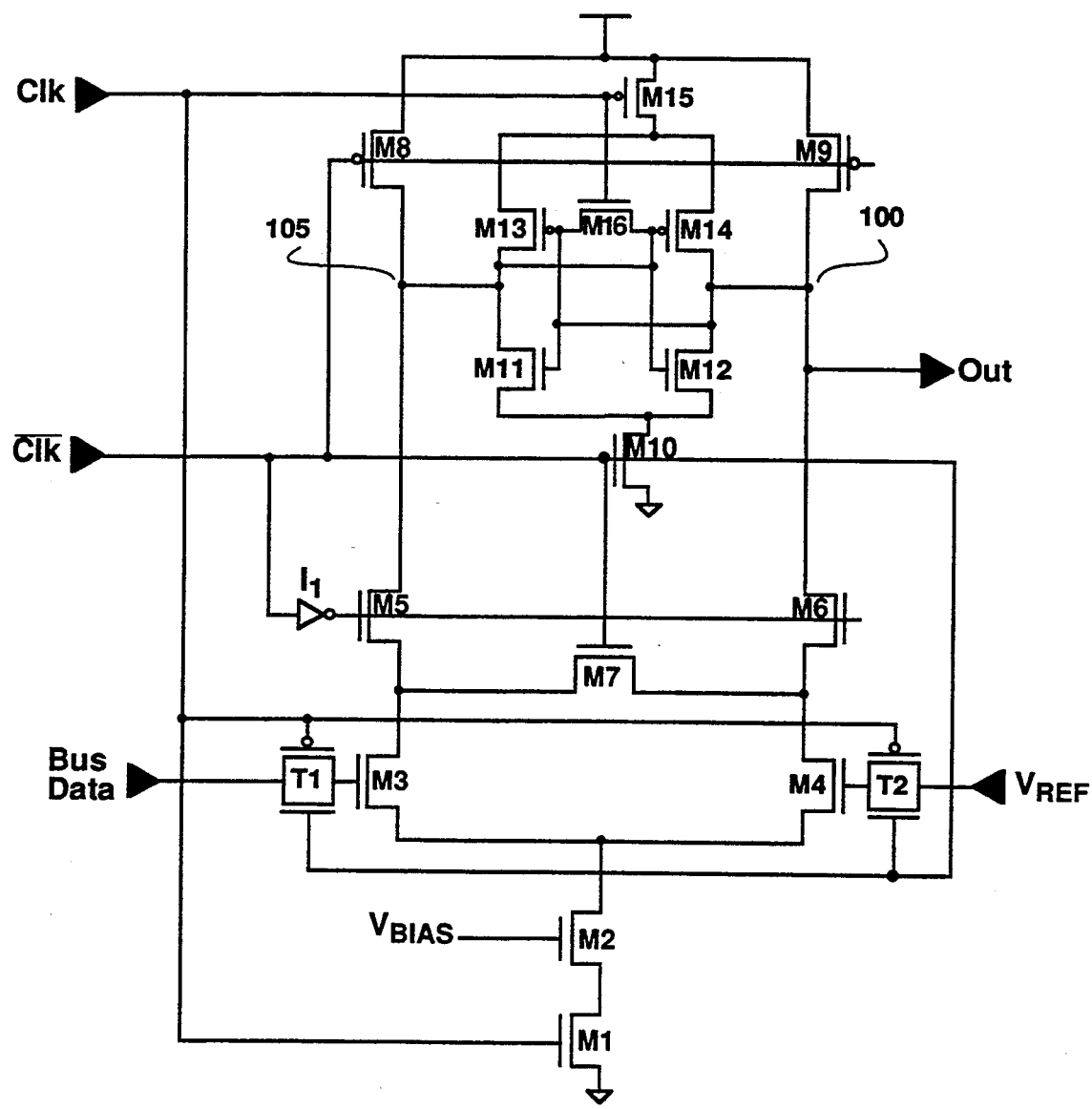

A preferred embodiment of the two stage sampler/amplifier is illustrated by FIG. 4b. The sampling stage consists of transistors M1 through M9 and transmission gates T1, T2. At the first clock, that is, when the clock (Clk) is low, isolation transistors M5 and M6 are off and T1, T2 and M7 are turned on. M7 equilibrates the drain nodes of M3 and M4 and ensures any drain to gate coupling for M3 and M4 is common mode. The gate nodes of transistors M3 and M4 track the voltage on the bus DATA and $V_{REF}$ inputs. At the next clock, that is, when the clock transitions high, the transmission gates T1, T2, are shut off and transistor M1 and isolation transistors M5 and M6 are turned on. I1, an asymmetric delay element (i.e., rises slow from low to high, falls fast from high to low), is used to delay the turn on of M5 and M6 until nodes 100 and 105 are equalized. This also ensures that any drain to gate coupling of M3 and M4 is common mode. When M1 is turned on, power is supplied to activate the differential amplifier consisting of current source M1, M2, current steering transistors M3, M4 and load transistors M8, M9. The outputs of the differential amplifier are approximately equal to the inputs, DATA and $V_{REF}$, with a slight gain. The gain of the amplifier is intentionally kept small, preferably unity, to minimize the noise that is back injected into the inputs, DATA and $V_{REF}$. As isolation transistors M5 and M6 are on, the outputs of the differential amplifier are transferred from M3 and M4 to nodes 100, 105.

One purpose of the first stage of the circuit is to transfer the input differential voltage to the second stage, cross coupled sense amplifier consisting of transistors M10 through M16. As the second stage is isolated from the first stage when the isolation transistors are turned off, large swing voltage levels are not back injected into the DATA and $V_{REF}$ inputs. While the clock is high, M16 is on, which serves to equilibrate the sense amplifier from the previous clock but also appears to short the differential voltage developed by the differential amplifier stage of the circuit. However, the load transistors M8 and M9 are strong enough that the bias level of the differential signal is maintained above the threshold of the transistor M16. Thus, M16 is fairly resistive and the differential voltage can be developed. When the clock transitions low, the cross coupled sense amplifier is activated and the initialized voltage differential is amplified to a full swing signal in output.

The resultant circuit provides a CMOS compatible receiver which operates on a high speed current mode bus. Although the invention has been described in conjunction with the preferred embodiment, it is evident that numerous alternatives, modifications, variations and uses will be apparent to those skilled in the art in light of the foregoing description. In particular the CMOS receiver disclosed as the preferred embodiment may be adapted to other MOS technologies by one skilled in the art and still be within the spirit and scope of the present invention.

What is claimed is:

1. A high speed bus system for coupling at least one master device to at least one slave device, said bus comprising at least one transmission line for transmission of signals, said master device and said slave device coupled to the transmission line;

each master device and slave device comprising a bus driver and bus receiver;

said bus driver comprising a current mode source to drive current along the transmission line, said bus receiver comprising at least one sampler/amplifier circuits which sample the received signal and amplify the signal from a small swing voltage level to a large swing voltage level compatible with the device coupled to the receiver, each of said sampler/amplifier circuits comprising, a first stage sampler circuit for sampling the received signal, a second stage amplifier circuit for amplifying the received signal to a voltage level compatible with the device coupled to the receiver, said second stage electrically isolated from the first stage, and means for transferring the sampled received signal from the first stage to the second stage;

whereby the parasitic capacitive charge that is back injected onto the transmission line by the first stage sampler circuit is minimized by maintaining a small swing signal at the first stage and transferring the sampled small swing signal to the isolated second stage prior to amplifying the small swing signal to a large swing signal and the signal received by the bus receiver is output rapidly in a form compatible with the device coupled to the bus receiver.

2. The high speed bus system as set forth in claim 1, wherein said receiver circuit comprises a first and second sampler/amplifier circuit, said first sampler/amplifier circuit operating on a first edge of the clock and said second sampler/amplifier operating on a second edge of the clock.

3. The high speed bus system as set forth in claim 1, wherein said small swing signal comprises a swing of approximately 500 millivolts wherein $V_{OL}$ approximately equals 2.0 volts and $V_{OH}$ approximately equals 2.5 volts.

4. The high speed bus system as set forth in claim 1, wherein said receiver circuit comprises CMOS circuitry.

5. The high speed bus system as set forth in claim 4, wherein said small swing signal comprises a swing of approximately 500 millivolts wherein $V_{OL}$ approximately equals 2.0 volts and $V_{OH}$ approximately equals 2.5 volts and said large swing signal comprises a swing of approximately 5 volts wherein $V_{OL}$ approximately equals 0.0 volts and $V_{OH}$ is in the range of approximately 3.3 to 5.0 volts.

6. The high speed bus system as set forth in claim 1, wherein said first stage sampler circuit comprises a differential amplifier having a gain close to unity.

7. The high speed bus system as set forth in claim 1, wherein said second stage amplifier circuit comprises a sense amplifier.

8. The high speed bus system as set forth in claim 1, wherein said first stage sampler circuit is isolated from said second stage amplifier circuit by isolation transistors, said isolation transistors, when in an off state, isolate the first stage sampler circuit from the second stage amplifier circuit.

9. The high speed bus system as set forth in claim 8, wherein said means for transferring the sampled received signal from the first stage to the second stage comprises said isolation transistors in an on state.

10. The high speed bus system as set forth in claim 9, wherein the bus driver comprises an NMOS transistor operating as a constant current source.

11. A high speed bus system for coupling at least one master device to at least one slave device, said bus comprising at least one low impedance transmission line for transmission of signals, said master device and said slave device coupled to the at least one transmission line;

each master device and slave device comprising at least a bus driver and bus receiver;

said bus driver comprising current mode source to drive current along the transmission line at a low, small swing voltage, said bus receiver comprising a plurality of sampler/amplifier circuits which sample the received signal and amplify the signal from the small swing voltage level to a large swing voltage level compatible with the device coupled to the receiver, each of said sampler/amplifier circuits operating on alternate clocks to increase the throughput of the receiver, each of said sampler/amplifier circuits comprising, a first stage circuit for sampling the received signal, said first stage comprising a differential amplifier having a gain close to unity, a second stage circuit comprising a sense amplifier for amplifying the received signal to a voltage level compatible with the device coupled to the receiver, said second stage electrically isolated from the first stage, and means for transferring the sampled received signal from the first stage to the second stage;

whereby the parasitic capacitive charge that is back injected onto the transmission line by the first stage circuit is minimized by maintaining a small swing signal at the first stage and transferring the sampled small swing signal to the isolated second stage prior to amplifying the small swing signal to a large swing signal and the signal received by the bus receiver is output rapidly in a form compatible with the device coupled to the bus receiver.

12. The high speed bus system as set forth in claim 11, wherein said small swing signal comprises a swing of approximately 500 millivolts wherein $V_{OL}$ approximately equals 2.0 volts and $V_{OH}$ approximately equals 2.5 volts.

13. The high speed bus system as set forth in claim 11, wherein said receiver circuit comprises CMOS circuitry.

14. The high speed bus system as set forth in claim 11, wherein said first stage sampler circuit is isolated from said second stage amplifier circuit by isolation transistors, said isolation transistors, when in an off state, isolate the first stage sampler circuit from the second stage amplifier circuit.

15. The high speed bus system as set forth in claim 14, wherein said means for transferring the sampled received signal from the first stage to the second stage comprises said isolation transistors in an on state.

16. In a high speed bus system for coupling at least one master device to at least one slave device, said bus comprising at least one transmission line for transmission of signals, said master device and said slave device coupled to the at least one transmission line a method for transmitting signals between a transmitting device and a receiving device of the master and slave devices, said method comprising the steps of:

driving a signal on the bus utilizing a current mode source to drive current along the transmission line at a small swing voltage;

sampling the signal at a first stage of the receiver device;

transferring the sampled signal to a second stage of the receiver device, said second stage electrically isolated from the first stage;

amplifying the sampled received signal from the small swing voltage to a large swing voltage level compatible with a device coupled to the receiver;

whereby parasitic capacitive charge that is back injected onto the transmission line by the first stage circuit is minimized by maintaining a small swing signal at the first stage and transferring the sampled small swing signal to the isolated second stage prior to amplifying the small swing signal to a large swing signal and the signal received by the bus receiver is output rapidly in a form compatible with the device coupled to the bus receiver.

17. The method as set forth in claim 16, wherein said small swing signal comprises a swing of approximately 500 millivolts wherein $V_{OL}$ approximately equals 2.0 volts and $V_{OH}$ approximately equals 2.5 volts.

18. A high speed bus configuration for coupling at least one master device to at least one slave device, said bus comprising:

at least one transmission line, said master device coupled to a first end of the transmission line, said slave device coupled to the transmission line at a point between the first end and a second end of the transmission line;

a termination resistor located at the second end of the transmission line, said resistor having an impedance equivalent to the impedance of the transmission line whereby signals which travel to the second end of the transmission line are absorbed;

said slave device communicating to the master device by producing a drive current which is divided at the output of the slave device to generate first and second ½ swing signals, the first ½ swing signal propagating towards the second end of the transmission line and said second ½ swing signal propagating towards the first end of the transmission line;

said terminating resistor absorbing the first ½ swing signal, said second ½ swing signal reaching the first end of the transmission line and reflecting back towards the second end of the bus, said master devices located at the first end of the bus receiving a full swing signal resulting from the sum of the first ½ swing signal and reflected first ½ swing signal;

whereby the power dissipation along the bus is minimized without increasing the time of flight delay ($t_f$) of the bus and the effectiveness of the master and slave devices as bus drivers is increased.

19. The high speed bus configuration as set forth in claim 18, wherein bus drivers of the master and slave devices are current drivers and present a high impedance to the bus, whereby signals transmitted to drivers continue to propagate down the bus without secondary reflections caused by low impedance drivers.

20. The high speed bus configuration as set forth in claim 18, wherein bus receivers of the master and slave devices comprise a plurality of sampler/amplifier circuits which sample the received signal and amplify the signal from a small swing voltage level to a large swing voltage level compatible with the device coupled to the receiver, each of said sampler/amplifier circuits operating on alternate clocks to increase the throughput of the receiver, each of said sampler/amplifier circuits comprising, a first stage sampler circuit for sampling the received signal, a second stage amplifier circuit for amplifying the received signal to a voltage level compatible with the device coupled to the receiver, said second stage electrically isolated from the first stage, and means for transferring the sampled received signal from the first stage to the second stage;

whereby the parasitic capacitive charge that is back injected onto the transmission line by the first stage sampler circuit is minimized by maintaining a small swing signal at the first stage and transferring the sampled small swing signal to the isolated second stage prior to amplifying the small swing signal to a large swing signal and the signal received by the bus receiver is output rapidly in a form compatible with the device coupled to the bus receiver.

21. The high speed bus configuration as set forth in claim 18, wherein bus drivers of the master and slave devices are current drivers and transmit a small swing signal comprising a swing of approximately 500 millivolts wherein $V_{OL}$ approximately equals 2.0 volts and $V_{OH}$ approximately equals 2.5 volts.

22. The high speed bus configuration as set forth in claim 18, wherein said master devices communicates with the slave device by driving a full swing signal which propagates from the master device at the first end of the transmission line towards the slave device and the second end of the transmission line.

23. The high speed bus system as set forth in claim 1 wherein each of the sampler/amplifier circuits operating on alternate clocks to increase the throughput of the receiver.

* * * * *